United States Patent [19]

Thim

[11] Patent Number: 4,713,676
[45] Date of Patent: Dec. 15, 1987

[54] LOGIC CIRCUIT ARRANGEMENT WITH FIELD EFFECT TRANSISTORS MATCHED THERETO

[76] Inventor: Hartwig W. Thim, Wolfauerstrasse 10, A4040 Linz, Austria

[21] Appl. No.: 721,797

[22] Filed: Apr. 10, 1985

[30] Foreign Application Priority Data

Apr. 10, 1984 [AT] Austria ................. 1194/84

[51] Int. Cl.[4] ............................................. H01L 29/78
[52] U.S. Cl. ................... 357/23.5; 357/23.9; 357/23.12; 357/29; 357/54
[58] Field of Search ............ 357/23.5, 23.9, 23.12, 357/54, 29

[56] References Cited

U.S. PATENT DOCUMENTS

| | | | |
|---|---|---|---|
| 4,334,347 | 6/1982 | Goldsmith et al. | 357/23.5 |
| 4,441,036 | 4/1984 | Oldham | 307/242 |
| 4,467,453 | 8/1984 | Chiu et al. | 357/23.5 |
| 4,521,448 | 6/1985 | Sasaki | 357/23.5 |

OTHER PUBLICATIONS

Siemens Forsch-u. Entwickl.-Ber., vol. 4, 1975, No. 6, pp. 345-351, "Erasable and Electrically Reprogrammable Read-Only Memory Using the N-Channel SIMOS One-Transistor Cell" by B. Rossler et al.

Primary Examiner—Joseph E. Clawson, Jr.
Attorney, Agent, or Firm—Hill, Van Santen, Steadman & Simpson

[57] ABSTRACT

A logic circuit arrangement has direct coupling of a drain and gate of two successive stages. At least one of the FET's has a buried electrode layer with adjacent, non-tunnelable insulator layers. The electrode layer is electrically charged from the outside by irradiation so that the zone comprising the length $L_g$ has a normally-off character.

8 Claims, 4 Drawing Figures

LOGIC CIRCUIT ARRANGEMENT WITH FIELD EFFECT TRANSISTORS MATCHED THERETO

BACKGROUND OF THE INVENTION

The invention relates to a logic circuit arrangement suitable for short switching times, for large-scale integration with high component density, and for operation as a power supply with only one polarity of a supply voltage. A field effect transistor is provided in one stage whose drain is direct coupled to a gate of a field effect transistor of a following stage.

Logic circuit arrangements of which a plurality of demands are made are used for digital and analog data processing. On the one hand, such a logic circuit should be realizable with high component density, i.e. for very large-scale integrated circuits (VLSI). Such a circuit should have a high processing speed. Transistors of the silicon bipolar technology, silicon MOS technology and/or transistors of compound semiconductor material such as, for example, MESFET and/or MISFET components, are employed for such circuits.

In addition to the aforementioned component density and the required high switching time, further demands are also made. Specifically, high driver strength, low dissipated power, high signal-to-noise ratio, and/or small differences of the value of the threshold voltage for a plurality of such components integrated on one chip are required. Specifically for analog circuits, the output power, the ratio between radio-frequency (rf) power and power (DC) consumption, and the noise figure play a part.

As an example of such a circuit (known per se), FIG. 1 shows a circuit comprising a NOR gate and a following inverter stage. This circuit is operated with a supply voltage $V_{DD}$. The desire is that such a circuit be operable with electrical voltage of only one polarity, both with respect to the supply voltage, as well as the drive voltages for the elements to be provided.

For the present invention, field effect transistors of the normally-off type are important, i.e. of the enhancement type, and that are non-conducting without gate voltage. By applying positive gate voltages $V_{e1}$, $V_{e2}$, these transistors are switched on or the transistor of the inverter stage becomes inhibiting due to the corresponding reduction of the potential $V_{a1}$.

Various such types are available as normally-off field effect transistors.

A gallium arsenide field effect transistor having an extremely thin, active gallium arsenide layer (about 50 nm thick) is known. Details thereof can be found in "1979 GaAs IC Symposium, Lake Tahoe, Sept. 1979". Such a field effect transistor is inhibiting without adjacent gate voltage and becomes conductive with gate voltage. Problems with such field effect transistors result in conjunction with integration because such low thickness of the active layer is difficult to observe over a larger chip area within those limits that are acceptable in view of compensatable fluctuations of the threshold voltage value. A further disadvantage is the unfavorable working range in the non-saturated part of the family of characteristics at low operating voltages, as a consequence whereof the steepness and high switching speed desired for a circuit of the invention would not be obtainable here.

Junction field effect transistors are also known, these comprising a pn diode instead of the Schottky diode, and their logical voltage boost being elevated by a few tenths of a volt. High edge capacitance of the p-region, however, leads to great switching delays.

Insulated gate field effect transistors (MISFET) are also known, the thin insulating layer of these below the Schottky gate serving the purpose of avoiding the high conducting state currents of the Schottky gate which appear given an applied positive gate voltage. A thickness of the insulating layer that is not exactly observed produces fluctuations in the threshold current value that are too great.

A further, known field effect transistor of the normally-off type is the HEMT transistor comprising an extremely thin (50 nm) layer of highly doped gallium aluminum arsenide under the Schottky gate and comprising an intentionally undoped, active gallium arsenide layer.

Realizing a logic circuit with direct coupling of successive transistors according, for example, to FIG. 1 with normally-off transistors of the above types leads to the problems that have already been shown.

For the sake of completeness, logic circuits with normally-on field effect transistors shall also be mentioned. Particularly belonging thereto are depletion MESFET field effect transistors. These, for example, have a 150 nm thick active layer of, for example, gallium arsenide on an electrically insulating substrate or, for example, preferably semi-insulating gallium arsenide. As a consequence of their greater layer thickness, such transistors in integrated circuits have relatively slight differences from one another with respect to the threshold voltage value. They also have a relatively short switching time and high reliability against disturbance. Their essential disadvantage, however, is that they require a gate voltage opposite the supply voltage $V_{DD}$ in order to be switched non-conductive. This induces an additional voltage supply. Additional switching delays and dissipated power thus also arise.

SUMMARY OF THE INVENTION

An object of the present invention is to specify techniques with which a logic circuit arrangement comprising the advantages of known technologies, but free of their disadvantages, is to be realized. In particular, the circuit arrangement of the invention should be such that, given optimally low technological manufacturing expense, it has high switching speed, low power dissipation, high driver strength, and does not require a further voltage source. For large-scale integration on a chip, the fluctuation of the values of the threshold voltage should be as low as possible given reasonable technological expense.

This object is achieved with a circuit arrangement wherein at least one of the transistors has an electrode layer disposed within the gate insulation and buried under the gate electrode. A first insulating layer portion of the gate insulation separates the gate electrode and the electrode layer from one another. A second insulating layer portion of the gate insulation separates the active semiconductor zone and the electrode layer from one another. The respective thicknesses of the first and second layers ($d'_i$, $d_i - d'_i$) are designed such that they cannot be tunnelled through by charge carriers during normal operation of the circuit arrangement. A respective insulating protective spacing is provided between the source and buried electrode layer and between the drain and the buried electrode layer so that zones in the active semiconductor zone are provided which are substantially uninfluenced by potentials of the buried electrode layer. The buried electrode layer has a surface-specific electrical charging $$Q_{HSS} \gtreqless \frac{\epsilon_i e N_D}{2\epsilon_h d'_i}\left(d_h^2 + 2d_h d_i \frac{\epsilon_h}{\epsilon_i} - \frac{2\psi_{mh}\epsilon_h}{e^2 N_D}\right) \ [Cb/cm^2]$$

Within the framework of the considerations that led to the present invention, it in fact turned out that a field effect transistor of the depletion type (normally-on) should nonetheless preferably form the basis for a technical teaching which resolves the stated object, even though numerous, yet still unsatisfactory, corresponding solutions are already known which have always proceeded on the basis of field effect transistors of the enhancement type.

A field effect transistor adapted for a logical circuit arrangement has been developed for the present invention, the details thereof being described in greater detail below.

DESCRIPTION OF THE PREFERRED EMBODIMENTS

Figure 1:
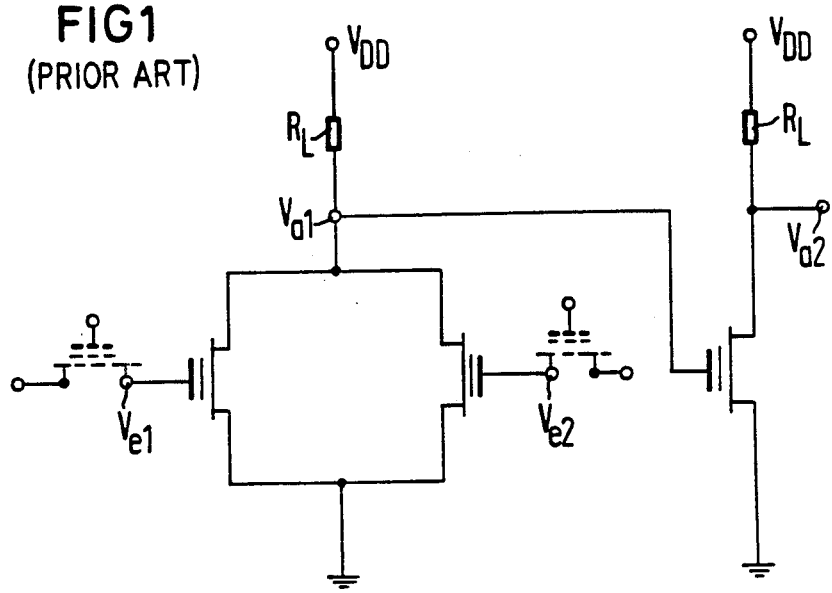
FIG. 1 is an illustration of a prior art logic circuit.

The field effect transistor employed in the invention has, in part, structural features that are fundamentally known per se from field effect transistors of various types. General knowledge about field effect transistors can be referenced with respect to the substrate, the active semiconductor layer disposed on the substrate, the source region and terminal, the drain region and terminal, as well as with respect to the gate electrode. In the invention, the field effect transistor has insulating material between the active semiconductor layer and the gate electrode, a deathnium trap in the execution of an electrically conductive electrode layer being embedded in said insulating material parallel to the expanse of the gate electrode or of the active semiconductor layer. The use of such an electrode layer disposed in such fashion is known per se, for example as a floating gate. For example, a semiconductor structure as a field effect transistor proceeds from German OS No. 30 32 306 or from U.S. Pat. No. 4,441,036, both incorporated herein by reference. This comprises a polysilicon layer in the inside of an insulating layer below a gate electrode to which the polysilicon layer is parallel. This layer likewise has no contact leading toward the outside. This field effect transistor disclosed by German OS No. 30 32 306 or U.S. Pat. No. 4,441,036 is provided for replacing a fuseable link in a circuit comprising redundant circuit elements or circuit groups. By charging this electrode layer of polysilicon by means of externally impressed electron radiation, this known logic element can be modified during manufacture of the circuit arrangement in which it is employed such that it is subsequently continuously conductive or continuously inhibited, i.e. effects a continuous electrical connection to a circuit part, or maintains a continuous interruption.

Merely for the sake of completeness, let MNOS field effect transistors employed as programmable memory elements be noted. They can have an electrode between the oxide layer and the nitride layer which is not to be connected toward the outside. The setting or modification of the respective memory status occurs by applying overvoltages and tunnel current of charge carriers through the oxide layer and/or the nitride layer. For this purpose, these layers have only a slight thickness, for example below 10 nm.

Differing from this Prior Art, according to the invention, during manufacture of the field effect transistors, a charging of the deathnium trap layer or electrode layer is provided so that this field effect transistor of the normally-on type has an effect like a normally-off type. On the basis of the normal operational selection of its gate or of its gate electrode, this can be driven from the inhibiting condition (given lack of gate voltage) into the conductive condition (given adjacent gate voltage). Thus, it can be reversibly provided as desired.

In accordance with an embodiment of the present invention, this deathnium trap or electrode layer is permanently charged in area-specific fashion with the assistance of an electron irradiation by an amount equal to or greater than $Q_{HSS}$ as follows:

$$Q_{HSS} \simeq \frac{\epsilon_i e N_D}{2\epsilon_h d'_i}\left(d_h^2 + 2d_h d_i \frac{\epsilon_h}{\epsilon_i} - \frac{2\psi_{mh}\epsilon_h}{e^2 N_D}\right) \ [Cb/cm^2] \quad (1)$$

In the above equation: $\epsilon_h$ is the dielectric constant of the semiconductor material of the active layer; $\epsilon_i$ is the dielectric constant of the insulator material surrounding the deathnium trap or electrode layer; $d_i$ is the spacing of the gate electrode from the surface of the active semiconductor layer; $d'_i$ is the spacing of the electrode layer from the gate electrode (the thickness of the electrode layer is negligible); $d_h$ is the thickness of the active semiconductor layer; $N_D$ is the doping of the active semiconductor layer with donors for n-conductive transistors (or acceptors for p-conductive transistors); w is the width of the source/drain contact; and $\Psi_{mh}$ is the work function difference of electrons (in volts) between the metal of the gate electrode and the semiconductor material.

The charge $Q_{HSS}$ ($Cb/cm^2$) to be exerted on the electrode layer is negative for n-conductive transistors and positive for p-conductive transistors. Somewhat higher charging, particularly 10 to 20% higher charging, produces a higher threshold voltage with correspondingly higher reliability against disruption.

When condition (1) is met, the electrical field strength proceeding from the charging of the deathnium trap layer or electrode layer just suffices given a gate voltage $V_{GS}=0$ to clear out the movable charge carriers existing under the gate electrode in the active semiconductor layer, the density of these charge carriers being given by equation (2):

$$N = N_D w L_g \left( d_h + \frac{\epsilon_h}{\epsilon_i} d_i - \sqrt{\frac{\epsilon_h^2}{\epsilon_i^2} d_i^2 + \frac{2\epsilon_h \psi_{mh}}{e^2 N_D}} \right) \quad (2)$$

In this equation, $L_g$ is the length over which the deathnium trap electrode layer extends between the source region and the drain region (with their spacing $L_K$) of the transistor of the invention. The elementary charge is referenced e. The spacing $d'_i$ is preferably selected equal to one-half the spacing $d_i$, i.e. the electrode layer is arranged at least approximately in the center between the surface of the active semiconductor layer and the gate electrode.

Figure 2:
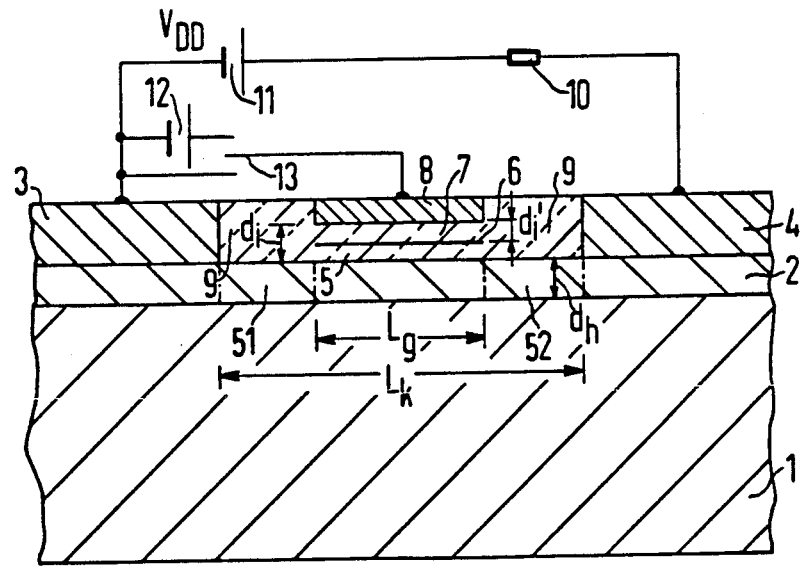
FIG. 2 is a cross-sectional illustration through a semiconductor body showing a field effect transistor according to the invention employed in the circuit of FIG. 1.

FIG. 2 shows an exemplary embodiment of a format of a transistor to be employed in the invention. The substrate is referenced 1, this substrate 1 being of insulating or semi-insulating material, or of material complementarily doped with respect to the active semiconductor layer 2 situated thereupon, in which core the substrate material is preferably semiconductor material. A source contact 3 and a drain contact 4 are provided, these being disposed on the surface of the active semiconductor layer 2 in the illustrated embodiment. They are non-blocking contacts. The gate electrode 8 as a control electrode of the transistor extends over the length $L_g$ between the illustrated source and drain contacts 3 and 4. In accordance with a modified embodiment, this gate electrode 8 is embedded in the material of an insulator layer. This is composed of the parts referenced 5, 7, and 9. It contains the deathnium trap layer or electrode layer 6. This electrode layer 6, preferably having the same length $L_g$, is electrically insulated from the surface of the active layer 2 by the part forming the insulating layer 5. The part forming the insulating layer 7 insulates the electrode layer 6 from the gate electrode 8. The spacings producing the layer thicknesses are illustrated as $d_i$ and $d'_i$.

The gate electrode 8 and the electrode layer 6 are preferably congruently dimensioned and arranged. The electrode layer 6, however, may also be somewhat shorter and/or somewhat narrower but is to be placed so as to be covered by the gate electrode 8.

A load resistor is referenced 10, the supply voltage source is referenced 11, and the control voltage is referenced 12. The control voltage 12 is to be applied to the gate electrode via the symbolically illustrated switch 13.

An important characteristic of the invention is that for example in comparison to MOS technology, the gate electrode dare not reach the source/drain regions and may definitely not overlap. This is known for MOS field effect transistors wherein a thin oxide layer is provided for the galvanic separation between the gate electrode on the one hand and the source/drain regions on the other hand. Since a corresponding spacing can be provided in the invention, the field oxide regions 9 which guarantee reliable insulation for the corresponding, adjacent electrodes are possible. The fact that this characteristic of the invention is possible at all is because the one or several transistors employed in the circuit arrangement of the invention and having an induced normally-off quality, only have this quality in the region (over the length $L_g$) which is equal to the corresponding expanse of the deathnium trap layer or electrode layer 6. As a consequence of the transistor employed, this has a normally-on character between the source contact or region and the neighboring edge of the deathnium trap layer or electrode layer 6, i.e. in the zone 51. The corresponding case applies to the zone 52. Given the present invention, the problem of adjusting gate electrode and source/drain regions relative to one another which otherwise exists is advantageously not present at all. No significant capacitance to source and drain occurs either.

It is recommendable to select the spacing (lateral in FIG. 2) between the electrode layer 6 on the one hand and source/drain region 3/4 on the other hand about at least equal to or larger than the layer thickness $d'_i$, namely the insulating distance between electrode layer 6 and gate electrode 8 or semiconductor 2.

It is important with respect to the invention to mention that in contrast, for example, to the afore-mentioned Prior Art, a technologically uncritical dimensioning of 150 nm, for example, with a doping of $10^{17}$ cm$^{-3}$, for example, can be selected in the invention for the thickness of the semiconductor layer 2, as is standard for MES field effect transistors of, however, the opposite type (depletion type). The layers 5 and 7 also have a well-governable, high thickness (equal to/- greater than 50 nm).

A directly coupled logic circuit arrangement can be realized with the invention which requires only one supply voltage $V_{DD}$ and whose fluctuations of the threshold voltages of individual transistors is negligibly small.

The manufacture of a field effect transistor employed in the invention occurs in accordance with method steps fundamentally known per se and with materials usually employed. The semiconductor material of the layer 2 can, for example, be silicon. Indium phosphide, gallium arsenide, gallium indium arsenide, etc., are also suitable. Compound semiconductor material, in particular, is of interest for the invention. For example, the implanted doping of the active semiconductor layer 2 can amount, for example, to $N_D=10^{17}$ cm$^{-3}$. Drain/source contacts can be N+ regions with a contact metallization situated thereon. Provided as electrode layer 6 is, for example, a 5 nm thick metal or semiconductor layer which is dimensioned, for example 500 nm long and 10 $\mu$m wide. The thickness $d_i$ of the insulator layer 7 (and of the layer 5) is, for example, 50 nm and it is composed, for example, of silicon dioxide, silicon nitride, aluminum oxide or the like. Corresponding material is employed for the field oxide 9. The charging of the deathnium trap layer or electrode layer 6 occurs with masking, for example a photoresist layer. The corresponding case applies to the gate electrode 8. The interconnects connecting the drain, gate and source regions (of the transistors of the circuit arrangement) are also applied to the surface in known fashion.

One advantage achieved with the invention is that no mobile charge carriers are present under the gate electrode in the active semiconductor layer 2 given a gate control voltage $V_{GS}=0$. Despite the semiconductor layer thickness $d_h$ (for example, 150 nm for $N_d=10^{17}$ cm$^{-3}$) standard for normally-on behavior, the transistor has normally-off behavior, so that a direct coupling to preceding and following stages can occur without additional circuit expense and with only one supply voltage $V_{DD}$. A further advantage is that, in the invention, a uniformity of the active layer can be observed over a large chip area such that only small fluctuations in the value of the threshold voltage arise. A further important advantage is the possibility, by employing a complementary transistor as load resistor (see FIG. 3 yet to be described), of connecting the gate electrode thereof to that of the switching transistor and to thus construct an extremely fast complementary logic low in dissipated power which is superior to known CMOS logic circuits in terms of switching speed. This is because of the gate overlap avoidable without further steps or structure in the invention and the fact that the drain/source punch-through is not present with the structure of the invention.

Further advantages are the low source and drain resistances, the short switching times typical of normally-on MES field effect transistors, the low dissipated gate power resulting from the direct coupling, the favorably high component density required for VLSI circuits, and the low fluctuations in threshold voltage important for high reliability.

A further advantage is that, differing from other normally-off transistors (enhancement and inversion types), the charge carrier transport does not occur at the insulator/semiconductor boundary surface at which the mobility is reduced to the boundary surface roughness, but occurs in the undisturbed semiconductor volume. In the new logic, too, however, the density of the energy states in the energy gap at the insulator/semiconductor boundary surface should also be kept low, so that charge carriers potentially residing in these states do not produce a "Fermi level pinning". This condition can be met by means of an especially clean management of the manufacturing process such as has already been disclosed for silicon MOSFETs and GaInAs, InP and GaAs MISFETs.

Figure 3:
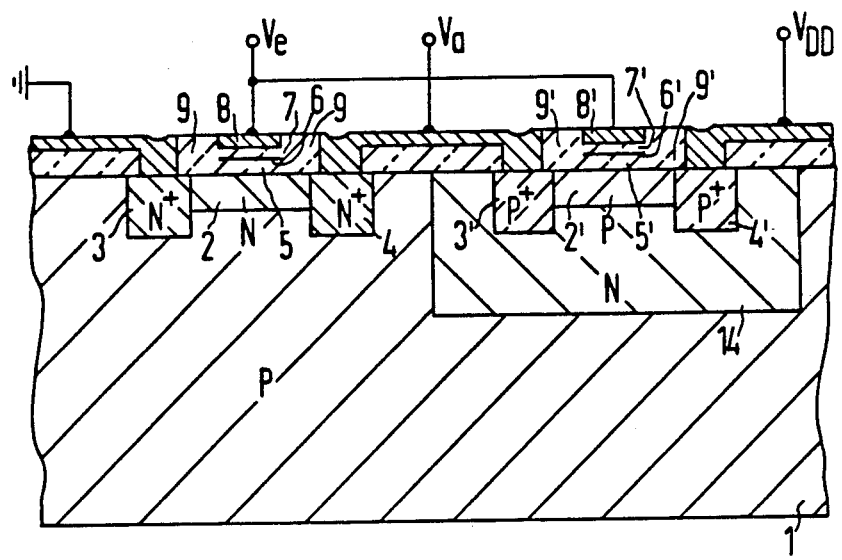
FIG. 3 shows a complementary arrangement of field effect transistors of the invention as may be employed in the circuit of FIG. 1.
Figure 4:
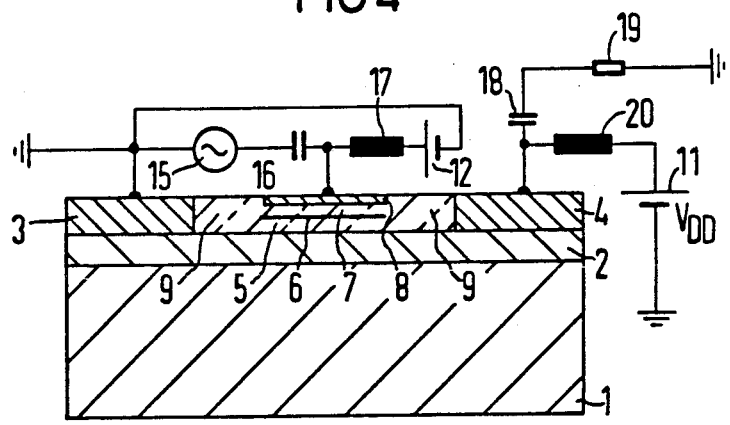
FIG. 4 shows a microwave amplifier with the field effect transistor of the invention.

FIGS. 3 and 4 show further examples of circuit arrangements of the invention. FIG. 3 is an aforementioned complementary circuit with a tub 14 which has a conductivity type opposite that of the surrounding semiconductor material. The reference characters employed in FIG. 3 have the meanings specified for FIG. 2. The reference characters provided with an additional 'a' have the corresponding meaning, but refer to the complementary transistor executed in the tub 14. An embodiment of FIG. 3 should be particularly realized in silicon technology. Apart from switching current, practically no current flows in this realization of a complementary circuit according to the invention.

FIG. 4 shows a microwave amplifier. In this circuit, the signal 15 to be amplified is applied to the gate 8 via the capacitor 16 which blocks the gate bias voltage 12. The inductance 17 conducts the gate bias voltage 12 to the gate 8 and keeps the signal of the signal generator 15 away from the battery 12. The amplified signal is conducted from the drain 4 to the load impedance 19 via the capacitor 18. The drain dc voltage 11 is supplied via the inductance 20 to the drain contact 4. The advantage of this circuit is its simplicity due to the identical polarities of the batteries 11 and 12 which can be replaced by a single supply voltage. This promotes monolithic integration ("MIC") and increases the frequency limit in comparison to normally-on MESFET circuits. The other reference characters correspond to those of FIG. 2. This circuit works as an analog amplifier or, with an additional feedback, as a self-oscillating oscillator (whereby the signal generator 15 can be omitted).

Although various minor changes and modifications might be proposed by those skilled in the art, it will be understood that I wish to include within the claims of the patent warranted hereon all such changes and modifications as reasonably come within my contribution to the art.

I claim as my invention:

1. A logic circuit arrangement suitable for short switching times, for large-scale integration with high component density, and for operation with a power supply with only one polarity of a supply voltage, comprising:
   a stage having a field effect transistor whose drain is direct coupled to a gate of a field effect transistor of a following stage;
   the field effect transistors each having an active semiconductor zone, source region, drain region, channel region, gate electrode, and gate insulation;
   at least one of the transistors having a source, drain, and channel region all of the same conductivity type and which would result in a normally on depletion type transistor but for a buried and charged electrode layer positioned within the gate insulation and buried under the gate electrode;
   a first insulating layer portion of the gate insulation separating said gate electrode and said electrode layer from one another, and a second insulating layer portion of the gate insulation separating the active semiconductor zone and said electrode layer from one another, the first and second layers having respective thicknesses $d_i'$ and $d_i-d_i'$ such that they cannot be tunnelled through by charge carriers during normal operation of the circuit arrangement;
   a respective insulsting protective lateral spacing between the source and the buried electrode layer, and between the drain and the buried electrode layer, being substantially greater than the thicknesses $d_i'$ and $d_i-d_i'$ and chosen so that non-aligned portions in the active semiconductor zone laterally of a vertically aligned portion of the active semiconductor zone beneath the gate electrode are substantially undepleted by the buried electrode layer so as to remain normally on; and
   the buried elecrode layer having an area-specific electrical charge $Q_{HSS}$ of $Q_{HSS}$ which is from 1 to 1.2 times $$\frac{\epsilon_i e N_D}{2\epsilon_h d_i'} \left( d_h^2 + 2 d_h d_i \frac{\epsilon_h}{\epsilon_i} - \frac{2\psi_{mh}\epsilon_h}{e^2 N_D} \right) \quad (Cb/cm^2)$$

where $\epsilon_h$ is a dielectric constant of the semiconductor material of the active zone, $\epsilon_i$ is a dielectric constant of the gate insulation, $d_h$ is a thickness of the active semiconductor zone, $N_D$ is a doping of the active semiconductor zone with donors for n-conductive transistors, and $\Psi_{mh}$ is a work function difference of electrons (in volts) between a metal of the gate electrode and a material of the active semiconductor zone, said electrical charge having a magnitude which defines a transition from inhibiting and normally off with no voltage applied to the gate electrode to conductive operation of the transistor with voltage applied to the gate electrode which undepletes the vertically aligned portion.

2. An arrangement according to claim 1 wherein for higher reliability against disruption, charging of the buried electrode layer is to be dimensioned about 10 to 20% higher than $Q_{HSS}$.

3. An arrangement according to claim 1 wherein two complementary transistors are provided having a same but complementary structure and which have a corresponding complementary charge.

4. An arrangement according to claim 1 wherein a material of the active semiconductor zone is III-V-compound semiconductor material.

5. An arrangement according to claim 1 wherein the electrode layer and associated first and second insulating layer portions are chosen so that charging can be effected by electron irradiation.

6. A logic circuit arrangement suitable for short switching times, for large-scale integration with high component density, and for operation with a power supply with only one polarity of a supply voltage, comprising:

a logic stage having first and second interconnected field effect transistors;

the field effect transistors each having an active semiconductor zone, source region, drain region, channel region, gate electrode, and gate insulation;

at least one of the transistors having a source, drain, and channel region all of the same conductivity type and which would result in a normally on depletion type transistor but for a buried and charged electrode layer positioned within the gate insulation and buried under the gate electrode;

a first insulating layer portion of the gate insulation separating said gate electrode and said electrode layer from one another, and a second insulating layer portion of the gate insulation separating the active semiconductor zone and said electrode layer from one another, the first and second layers having respective thicknesses $d_i'$ and $d_i - d_i'$ such that they cannot be tunnelled throuqh by charge carriers during normal operation of the circuit arrangement;

a respective insulating protective lateral spacing between the source and the buried electrode layer, and between the drain and the buried electrode layer, being substantially greater than the thickness $d_i'$ and $d_i - d_i'$ and chosen so that non-aligned portions in the active semiconductor zone laterally of a vertically aligned portion of the active semiconductor layer portion beneath the gate electrode are substantially undepleted by the buried electrode layer so as to remain normally on;

the buried electrode layer having an area-specific electrical charge $Q_{HSS}$ of $Q_{HSS}$ which is from 1 to 1.2 times $$\frac{\epsilon_i e N_D}{2\epsilon_h d_i'} \left( d_h^2 + 2d_h d_i \frac{\epsilon_h}{\epsilon_i} - \frac{2\psi_{mh}\epsilon_h}{e^2 N_D} \right) \; (Cb/cm^2)$$

where $\epsilon_h$ is a dielectric constant of the semiconductor material of the activity zone, $\epsilon_i$ is a dielecltric constant of the gate insulation, $d_h$ is a thickness of the active semiconductor zone, $N_D$ is a doping of the active semiconductor zone with donors for n-conductive transistors, and $\Psi_{mh}$ is a work function difference of electrons (in volts) between a metal of the gate electrode and a material of the active semiconductor zone; and the buried electrode layer being designed for being electrically charged externally by irradiation so that the vertically aligned portion of the acive semiconductor zone beneath the buried electrode layer has a normally-off character with no voltage applied to the gate electrode.

7. A microwave amplifier, comprising:

a semiconductor body having a field effect transistor with an active semiconductor zone, source region, drain region, channel region, gate electrode, and gate insulation;

the gate electrode being connected to a bias voltage, signal source, and inductance;

the source region being connected to a reference;

the drain region having an inductor connecting it to a voltage source, and a load impedance connecting through a coupling capacitor to the drain region;

the field effect transistor having a buried electrode layer positioned within the gate insulation and buried under the gate electrode;

a first insulating layer portion of the gate insulation separating said gate electrode and said electrode layer from one another, and a second insulating layer portion of the gate insulation separating the active semiconductor ozone and said electrode layer from one another, the first and second layers having respective thicknesses $d_i'$ and $d_i - d_i'$ such that they cannot be tunnelled through by charge carriers during normal operation of the circuit arrangement;

a respective insulating protective lateral spacing between the source and the buried electrode layer, and between the drain and the buried electrode layer, being substantially greater than the thickness $d_i'$ and $d_i - d_i$ and chosen so that non-aligned portions in the active semiconductor zone laterally of a vertically aligned portion of the active semiconductor zone beneath the gate electrode are substantially undepleted by the buried elecrode layer so as to remain normally on; and the buried electrode layer having an area specific electrical charge $Q_{HSS}$ of $Q_{HSS}$ which is from 1 to 1.2 times $$\frac{\epsilon_i e N_D}{2\epsilon_h d_i'} \left( d_h^2 + 2d_h d_i \frac{\epsilon_h}{\epsilon_i} - \frac{2\psi_{mh}\epsilon_h}{e^2 N_D} \right) \; (Cb/cm^2)$$

where $\epsilon_h$ is a dielectric constant of the semiconductor material of the active zone, $\epsilon_i$ is a dielectric constant of the gate insulation, $d_h$ is a thickness of the active semiconductor zone, $N_D$ is a doping of the active semiconductor zone with donors for n-conductive transistors, and $\Psi_{mh}$ is a work function difference of electrons (in volts) between a metal of the gate electrode and a material of the active semiconductor zone, said electrical charge having a magnitude which defines a transition from inhibiting and normally off with no voltage applied to the gate electrode top conductive operation of the transistor with voltage applied to the gate electrode which undepletes the vertically aligned portion.

8. A logic circuit arrangement suitable for short switching times, for large-scale integration with high component density, and for operation with a power supply with only one polarity of a supply voltage, comprising:

a stage having a field effect transistor whose drain is direct coupled to a gate of a field effect transistor of a following stage;

the field effect transistors each having an active semiconductor zone, source region drain region, channel region, gate electrode and gate insulation;

at least one of the transistors having a source, drain, and channel region all of the same conductivity type and which would result in a normally on depletion type transistor but for a buried and charged electrode layer positioned within the gate insulation and buried under the gate electrode;

a first insulating layer portion of the gate insulation separating said gate electrode and said electrode layer from one another, and a second insulating layer portion of the gate insulation separating the active semiconductor zone and said electrode layer from one another, the first and second layers having respective thicknesses $d_i'$ and $d_i - d_i'$ such that they cannot be tunnelled through by charge carriers during normal operation of the circuit arrangement;

a respective insulating protective lateral spacing between the source and the buried electrode layer, and between the drain and the buried electrode layer, being substantially greater than the thickness $d_i'$ and $d_i - d_i'$ and chosen so that non-aligned portions in the active semiconductor zone laterally of a vertically aligned portion of the active semiconductor zone beneath the gate electrode are substantially undepleted by the buried electrode layer so as to remain normally on; and the buried electrode layer having an area-specific electrical charge $Q_{HSS}$ of $Q_{HSS}$ is from 1 to 1.2 times $$\frac{\epsilon_i e N_D}{2\epsilon_h d_i'} \left( d_h^2 + 2d_h d_i \frac{\epsilon_h}{\epsilon_i} - \frac{2\psi_{mh}\epsilon_h}{e^2 N_D} \right) \ (Cb/cm^2)$$

where $\epsilon_h$ is a dielectric constant of the semiconductor material of the active zone, $\epsilon_i$ is a dielectric constant of the gate insulation, $d_h$ is a thickness of the active semiconductor zone, $N_D$ is a doping of the active semiconductor layer with acceptors for p-conductive transistors, and $\Psi_{mh}$ is a work function difference of electrones (in volts) between a metal of the gate electrode and a material of the active semiconductor zone, said electrical charge having a magnitude which defines a transition from inhibiting and normally off with no voltage applied to the gate electrode to conductive operation of the transistor with voltage applied to the gate electrode which undepletes the vertically aligned portion.

* * * * *